United States Patent
Mandelman et al.

(10) Patent No.: US 6,373,086 B1
(45) Date of Patent: Apr. 16, 2002

(54) NOTCHED COLLAR ISOLATION FOR SUPPRESSION OF VERTICAL PARASITIC MOSFET AND THE METHOD OF PREPARING THE SAME

(75) Inventors: Jack A. Mandelman, Stormville; Rama Divakaruni, Somers; Byeong Y. Kim, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/607,135

(22) Filed: Jun. 29, 2000

(51) Int. Cl.⁷ .................... H01L 27/108; H01L 29/76; H01L 29/94; H01L 31/119
(52) U.S. Cl. .................... 257/301; 257/302
(58) Field of Search ................ 257/295–310; 438/240–254

(56) References Cited

U.S. PATENT DOCUMENTS

| | | | |
|---|---|---|---|
| 4,745,087 A | 5/1988 | Iranmanesh | 437/69 |
| 4,824,793 A | 4/1989 | Richardson et al. | 437/47 |
| 5,360,758 A | 11/1994 | Bronner et al. | 437/52 |
| 5,451,809 A | 9/1995 | Shiozawa et al. | 257/516 |
| 5,827,765 A | 10/1998 | Stengl et al. | 438/243 |
| 5,933,748 A | 8/1999 | Chou et al. | 438/431 |
| 5,945,704 A | * 8/1999 | Schrems et al. | 257/301 |
| 5,981,332 A | 11/1999 | Mandelman et al. | 438/246 |

* cited by examiner

Primary Examiner—Tom Thomas
Assistant Examiner—Cuong Quang Nguyen
(74) Attorney, Agent, or Firm—Steven Capella Cantor Colburn LLP

(57) ABSTRACT

A deep trench capacitor having a modified sidewall geometry within the collar isolation region such that the threshold voltage of the vertical parasitic MOSFET between a buried-strap out-diffusion and a N+ capacitor plate is significantly increased as compared to a conventional arrangement. By forming a concave notch within the sidewalls of the capacitor, the electrical thickness of the gate dielectric is effectively thicker than its actual physical thickness. Thereby, a reduced amount of gate dielectric and dopant is needed for suppression of vertical parasitic MOSFET conduction.

9 Claims, 13 Drawing Sheets

NOTCHED COLLAR ISOLATION FOR SUPPRESSION OF VERTICAL PARASITIC MOSFET AND THE METHOD OF PREPARING THE SAME

BACKGROUND OF THE INVENTION

The present invention relates to modifying the geometry of a sidewall of a deep trench storage capacitor, and more particularly to the preparation of a notched collar isolation for suppression of vertical parasitic current leakage in a metal oxide semiconductor field effect transistor (MOSFET).

A MOSFET is used in forming dynamic random access memory (DRAM). A DRAM circuit will usually include an array of memory cells interconnected by rows and columns, which are known as wordlines and bitlines, respectively. Reading data from or writing data to memory cells is achieved by activating selected wordlines and bitlines. Typically, a DRAM memory cell comprises a MOSFET connected to a capacitor. The capacitor includes gate and diffusion regions which are referred to as either drain or source regions, depending on the operation of the transistor.

There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate. A trench MOSFET is a transistor where a surface of the channel region of the transistor is not parallel to the primary surface of the substrate and the channel region lies within the substrate. For a trench MOSFET, the surface of the channel region is usually perpendicular to the primary surface, although this is not required.

Specifically, trench capacitors are frequently used with DRAM cells. A trench capacitor is a three-dimensional structure formed into a silicon substrate. This is normally formed by etching trenches of various dimensions into the silicon substrate. Trenches commonly have N+ doped poly as one plate of the capacitor (a storage node). The other plate of the capacitor is formed usually by diffusing N+ dopants out from a dopant source into a portion of the substrate surrounding the lower part of the trench. Between these two plates, a dielectric layer is placed which thereby forms the capacitor.

To prevent carriers from traveling through the substrate between the adjacent devices, e.g. capacitors, device isolation regions are formed between adjacent semiconductor devices. Generally, device isolation regions take the form of thick field oxide regions extending below the surface of the semiconductor substrate. The most common early technique for forming a field oxide region is the local oxidation of silicon ("LOCOS") technique. LOCOS field oxidation regions are formed by first depositing a layer of silicon nitride ("nitride") on the substrate surface and then selectively etching a portion of the silicon nitride layer to form a mask exposing the substrate where the field oxidation will be formed. The masked substrate is placed in an oxidation environment and a thick silicon oxide layer is grown at the regions exposed by the mask, forming an oxide layer extending above and below the surface of the substrate. An alternative to LOCOS field oxidation is the use of shallow trench isolation ("STI"). In STI, a sharply defined trench is formed in the semiconductor substrate by, for example, anisotropic etching. The trench is filled with oxide back to the surface of the substrate to provide a device isolation region. Trench isolation regions formed by STI have the advantages of providing device isolation across their entire lateral extent and of providing a more planar structure. Using improved isolation, continued reductions in size are possible.

With continued scaling of minimum feature size in the DRAM array, reduction of the lateral dimensions (the openings) of the deep trench (DT) storage capacitor results. Further, the shift from currently practiced cell area of $8F^2$ (F is the minimum linewidth of the feature size that can be patterned with lithography) for planar MOSFET cells to a cell area of $7F^2$ and $6F^2$ for planar and vertical MOSFET cells. This is driving the design opening of the trench capacitor from a 1:2 towards a 1:1 width to length ratio. A reduction in the size opening of the storage trench makes filling the deep trench with conductive material more difficult. Further, the difficulty in filling the DT is further compounded since the collar isolation oxide thickness requirement does not scale significantly from generation to generation.

To reduce parasitic leakage along an upper portion of the trench, an oxide collar is provided. Another way to reduce parasitic leakage is to increase the amount of dopant in the well of the transistor. However, increasing the amount of dopant will typically increase the electric fields in the depletion regions. This results in a sharp increase in junction leakage.

Suppression of the vertical parasitic MOSFET leakage required for long data retention time, between the storage node diffusion (buried-strap out-diffusion) and the N+ buried-plate, along the trench sidewall, is constrained by the minimum thickness of the collar isolation oxide and/or the minium doping concentration in the deep portion of the array P-well. If desired to alleviate the DT fill difficulty by thinning the collar isolation oxide, the doping concentration in the array P-well is generally increased to compensate. However by increasing the P-well concentration, data retention time is degraded. Also, having a very small DT opening within the collar isolation region adds to the series resistance of the trench capacitor. An increased resistance limits the amount of charge that can be stored which thereby degrades the yield of a capacitor.

There is a need in the art for an improved method of preparing a notched collar isolation for suppression of vertical parasitic MOSFET and the product thereof.

BRIEF SUMMARY OF THE INVENTION

The present invention is a deep trench storage capacitor having a modified sidewall geometry within the collar isolation region. The deep trench capacitor, comprises a silicon substrate; a trench within the silicon substrate, the trench having one or more walls; first and second N+ plates positioned within the silicon substrate at a bottom portion of the trench; a P-well region within the silicon substrate positioned above the first and the second N+ plates; a notch formed within the one or more walls of the trench; a N+ strap disposed adjacent to the trench; an STI positioned adjacent to the trench and on a top portion of the silicon substrate; a node dielectric on the sidewalls of a lower portion of the trench; a first oxide coating disposed on the walls of the trench; a polycrystalline silicon disposed within the trench; and a second oxide coating disposed over the trench.

The present invention is also method of making a deep trench capacitor which comprises providing a silicon substrate; forming a notch within one or more walls of a trench within the silicon substrate; providing first and second N+ plates within the silicon substrate at a bottom portion of the trench, a P-well region within the silicon substrate positioned above the first and the second N+ plates, a N+ strap adjacent to the trench, an STI adjacent to the trench and on a top portion of the silicon substrate, a node dielectric on the sidewalls of a lower portion of the trench; a first oxide coating on the walls of the trench, a polycrystalline silicon within the trench, and a second oxide coating over the trench.

The above discussed and other features and advantages of the present invention will be appreciated and understood by those skilled in the art from the following detailed description and drawings.

BRIEF DESCRIPTION OF THE DRAWINGS

The present invention will now be described, by way of example only, with references to the accompanying drawings which are meant to be exemplary, not limiting, wherein like elements are numbered alike in several Figures, in which.

DETAILED DESCRIPTION OF THE PREFERRED EMBODIMENTS

A deep trench storage capacitor having a modified sidewall geometry within the collar isolation region is described. The modification is such that the threshold voltage of the vertical parasitic MOSFET between a buried-strap outdiffusion and a N+ capacitor plate is significantly increased as compared to a conventional arrangement. This is achieved by exploiting the dependence of the MOSFET threshold voltage on the curvature of the gated silicon surface within a plane containing the channel current. If the gated silicon surface is concave in relation to the gate conductor, then the magnitude of the threshold voltage is increased. This increase in the threshold voltage results from a weakening of the parasitic vertical MOSFET gate electric field due to the spreading of the field lines within a region of curvature of the gated silicon surface. Thus, the electrical thickness of the gate dielectric (collar oxide) in the region of the curvature is thicker than its actual physical thickness. The minimum radius of curvature thereby affects the thickness of the insulator. As such, smaller radii of curvatures produce larger increases in the electrical thickness of an insulator.

Figure 1:
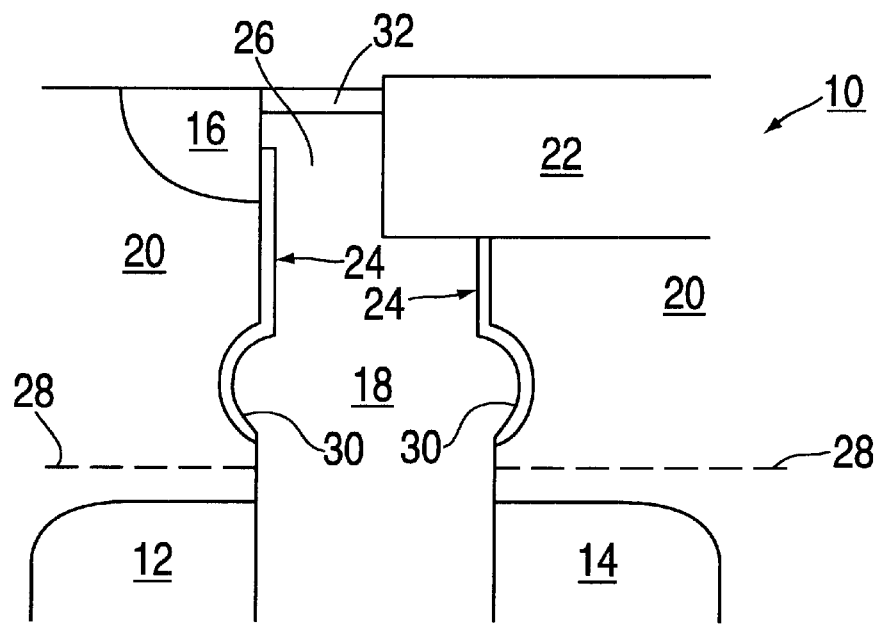
FIG. 1 is a cross-section of a deep trench capacitor having a notched sidewall in accordance with the present invention wherein the notch forms a concave portion into the P-well above the N+ plate.
Figure 2:
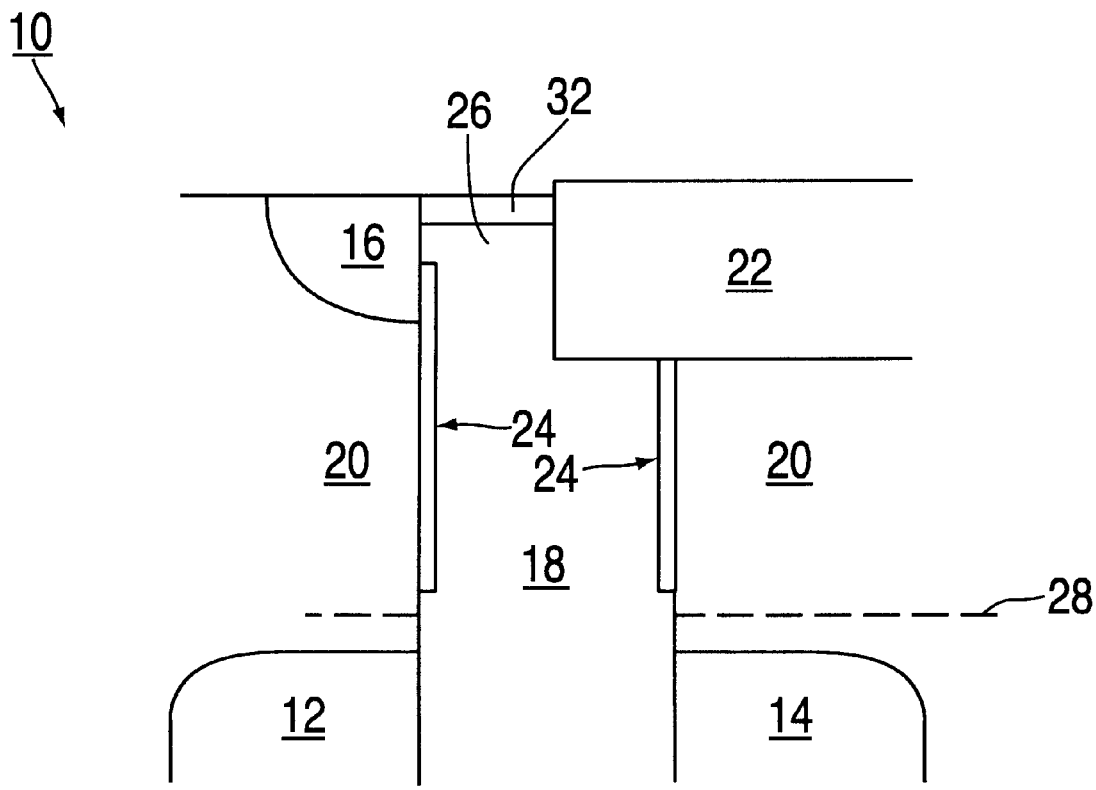
FIG. 2 is a cross-section of a prior art deep trench capacitor having a straight sidewall.

Referring to FIG. 1, an illustration of a preferred embodiment of a deep trench storage capacitor 10 is shown. A N+ polycrystalline silicon (poly) 18 fills trench 26. In a bottom portion of trench 26, opposing N+ plates (buried plates) 12 and 14 are separated by poly 18. Also, P-well 20 is separated by poly 18 and are positioned above N+ plates 12 and 14, respectively. A shallow trench isolation ("STI") 22 forms a high quality oxide layer. Over the trench, a trench top oxide ("TTO") 32 is formed for insulation. A N+ strap (buried strap) out-diffusion 16 is connected at the top of the capacitor 10 to a pass transistor of the cell for out-diffusion. One conventional way to form a strap is by forming a blanket deposition of strap material which is then subsequently removed from the top surfaces via etching. Another, preferred way of forming a strap is by out-diffusion of dopant impurity from the N+ poly 18 in the trench, through an aperture in the collar oxide 24 on the sidewall of the trench. On the walls of the trench, a LOCOS collar oxide 24 is formed adjacent to the walls of P-well 20, and node dielectric ("NODE DIEL") is formed between the N+ plates 12 and 14 and the trench sidewall. A concave portion (notch) 30 is formed in the sidewall surface of the trench with respect to the N+ poly 18. It is this concavity of the surface that results in an increased threshold voltage. For example, a threshold voltage increase of about 3 volts is obtained by using about a 30 nm minium radius of curvature and a collar oxide thickness of about 30 nm. This is approximately a 50% increase in the threshold voltage as compared to a structure without the concavity as shown in prior art FIG. 2.

Figure 3:
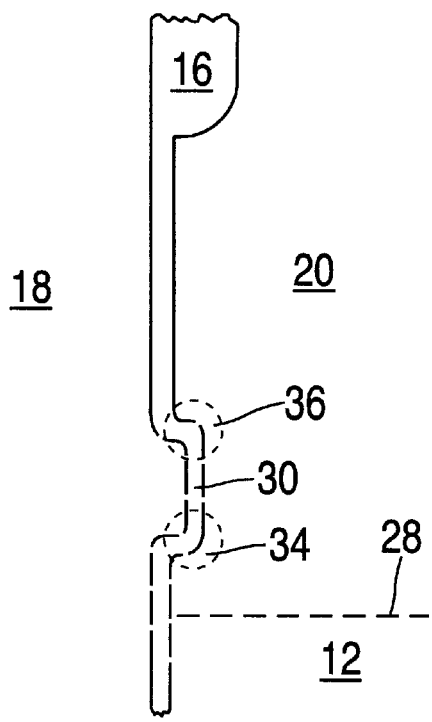
FIG. 3 is a cross-section of a portion of the sidewall of FIG. 1 showing a notch having two points of minium radius of curvature.

In a first embodiment of the invention, shown in FIG. 3, a cross-sectional portion of a DT capacitor's sidewall is shown with notch 30 being completely positioned above the N+ plate 12 and into the wall of P-well 20. A junction 28 is a region where N+ plate 12 and P-well 20 meet. In this embodiment, the notch 30 is formed into the sidewall of the DT capacitor above junction 28 and has two regions of minimum curvature 34 and 36 which are both located within the wall of P-well 20. The radius of curvature of regions 34 and 36 preferably is in the range of about 2 nm to about 50 nm. As formed, the structure effectively suppresses vertical parasitic MOSFET current between the N+ plate 12 and the N+ strap diffusion 16. This is due to the two regions of minimum curvature 34 and 36 because these regions form potential barriers that impede the transport of inversion charge, which are electrons in this case.

Figure 4:
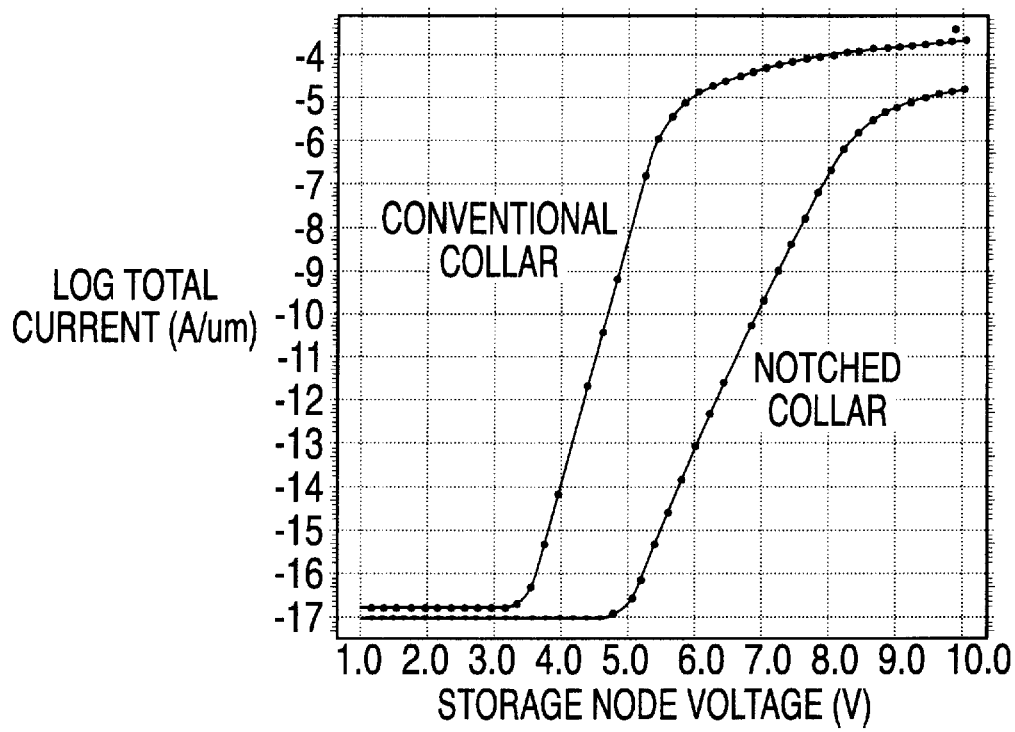
FIG. 4 is a graphical comparison of the vertical parasitic MOSFET of a conventional collar isolation compared to the notched collar of FIG. 1.

In FIG. 4, a graphical comparison of the vertical parasitic MOSFET current of a conventional collar (straight) isolation is compared to a notched collar in accordance with the first embodiment of the invention. Herein, an increase in the threshold voltage of about 3 volts is obtained wherein the two minimum of radii of curvature are each about 30 nm and the thickness of the collar oxide is about 30 nm. The minimum radius of curvature is limited by the ability to etch a sharp corner. The thickness of the collar oxide ranges from about 20 nm to about 40 nm, depending on the desired electrical operating voltages. The doping profiles and collar oxide thickness are identical in both cases.

Figure 5:
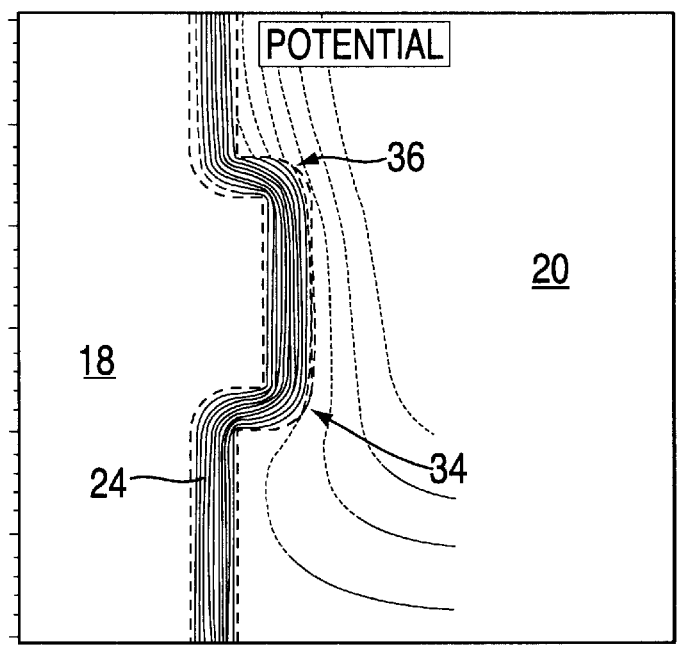
FIG. 5 is a cross-section of a portion of the sidewall of FIG. 1 wherein simulated equipotential contours are shown in the area of the sidewall notch.

Referring to FIG. 5, simulated equipotential contours are shown in the area of sidewall notch 30. As shown, the distortion of the potential in the region about the concavity of notch 30 results in an electric potential barrier, which impedes the transport of electrons from the N+ plate 12 to the N+ strap 16. Thus, the threshold voltage of the vertical parasitic MOSFET is increased. The potential about the minimum curvatures 34 and 36 are effective as potential barriers. In FIG. 5, a storage node voltage (the voltage on the N+ poly 18) is 6.0 volts, the N+ plate 12 voltage is 0.75 volts, and the voltage of the P-well 20 is −0.5 volts.

Figure 6:
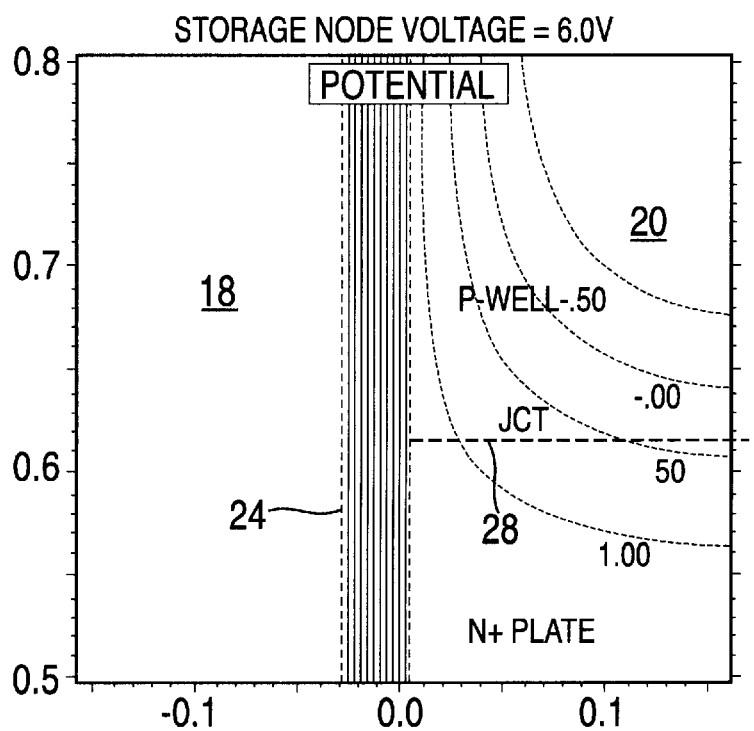
FIG. 6 is a cross-section of a portion of a prior art sidewall having no enhanced potential barrier within the P-well wherein simulated equipotential contours are shown.

In prior art FIG. 6, a conventional collar isolation structure of a DT capacitor is shown. As no notch is placed within the DT sidewall, there is no enhanced potential barrier within the wall of P-well 20. Thus, the threshold voltage of the vertical parasitic MOSFET is significantly lower than for the first embodiment shown in FIG. 5. Tantamount to the first embodiment, the storage node voltage is 6.0 volts, the N+ plate 12 voltage is 0.75 volts, and the voltage of the P-well 20 is −0.5 volts.

Figure 7:
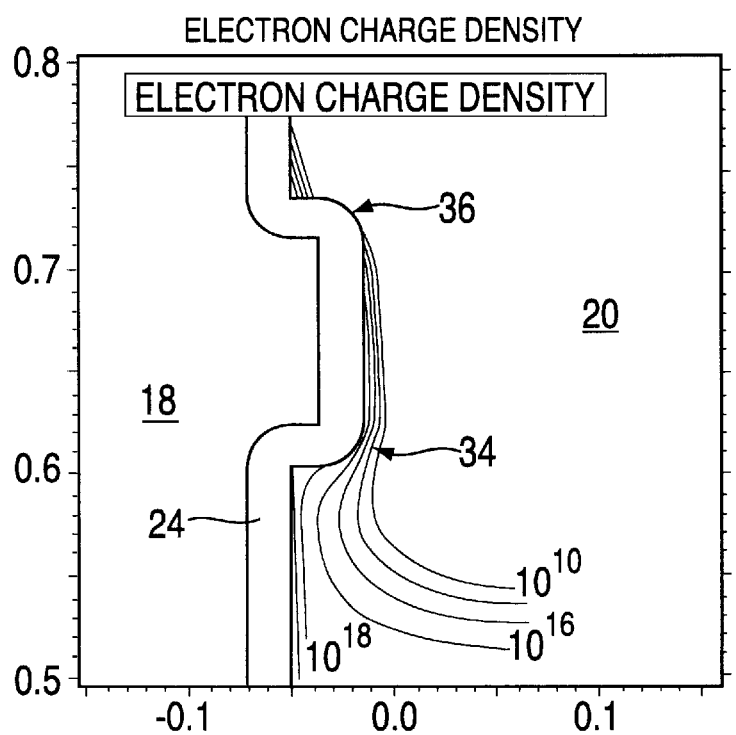
FIG. 7 is a cross-section of a portion of the sidewall of the FIG. 1 showing the electron charge density around the notch.

Electric potential distributions within the channel of the vertical parasitic MOSFET is significant in comparing the notch of the first embodiment to that of the conventional collar isolation structure. FIG. 7 shows the notch collar isolation of the first embodiment. With this notch, the inversion layer is essentially extinguished at the upper minimum radius of curvature 36. Particularly, this drastic reduction in inversion charge density (electrons in this example of the first embodiment) occurs because the upper minimum radius of curvature point is designed to coincide with the peak of P-well 20's concentration, which controls the threshold voltage of the parasitic MOSFET. For this model of the first embodiment, the storage node voltage is about 6.0 volts, the N+ plate 12 voltage is about 0.75 volts, and the voltage of the P-well 20 is about −0.5 volts.

Figure 8:
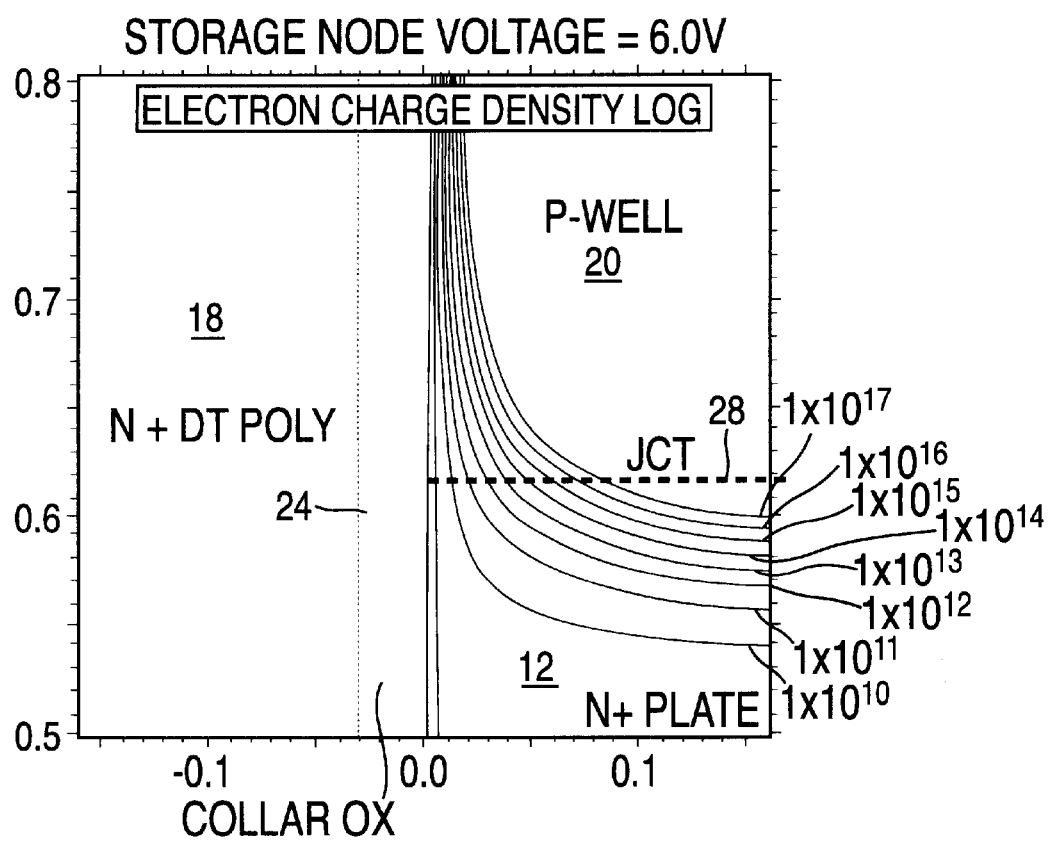
FIG. 8 is a cross-section of a portion of a prior art sidewall having no enhanced potential barrier within the P-well showing the electron charge density.

Referring to prior art FIG. 8, simulated contours of the electron charge density (inversion layer) for a conventional collar isolation structure is shown. Since the planarity of the DT sidewall does not produce an enhanced potential barrier within the wall of P-well 20, the electron charge density profile in the vertical direction is relatively uniform, which is unlike the profile seen in FIG. 7. The only variation observed is a normal variation in the inversion charge density for a MOSFET whose channel lies in a plane due to the variation of the potential in the parasitic channel. The physical thickness of the collar oxide and the doping profiles are identical in both the notched and conventional collars of FIGS. 7 and 8, respectively. As can be seen, the threshold voltage of the vertical parasitic MOSFET in the conventional structure is significantly lower than for the notched structure. Tantamount to the first embodiment in FIG. 7, the storage node voltage is about 6.0 volts, the N+ plate 12 voltage is about 0.75 volts, and the voltage of the P-well 20 is about −0.5 volts.

Figure 9A:
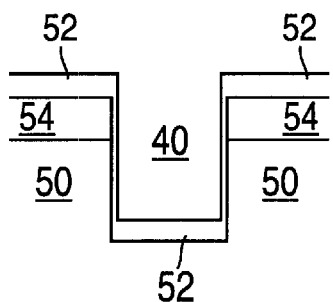
FIGS. 9a–9d illustrates a process of fabricating the structure of the first embodiment in accordance with a present invention wherein a notch is formed in the P-well above the N+ plates.
Figure 9B:
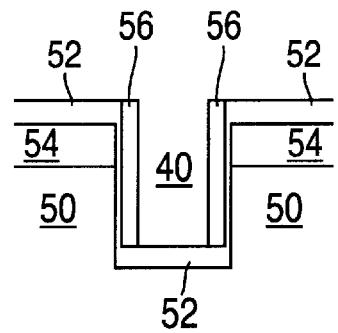
Figure 9C:
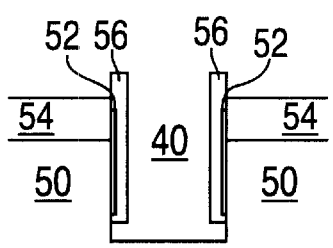
Figure 9D:
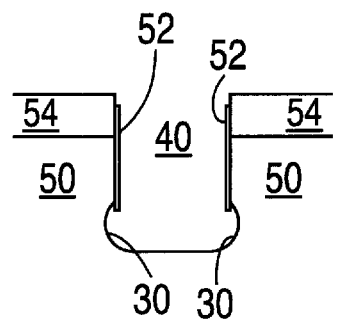

The process of fabricating the structure of the first embodiment is shown in FIGS. 9a–9d. In FIG. 9a, a silicon body 50 is shown having a pad nitride 54 on the surface of body 50 that is etched. Optionally, a deposited oxide layer (such as borosilicate glass) maybe formed over pad nitride 54 prior to etching the trench. In body 50, a partially etched trench 40 is shown etched to a predetermined depth. After partially etching, a layer of high density plasma ("HDP") oxide 52 is deposited. As shown in FIG. 9b, this is followed by depositing a layer of polysilicon that is reactive ion etched ("RIE") to form spacers ("poly spacers") 56 on the trench sidewall. Thereafter, the exposed HDP oxide 52 is isotropically etched. The isotropic etching is E continued so that the HDP oxide 52 that is under the poly spacers 56 is slightly undercut to form curvatures 30 in the sidewalls as shown in FIG. 9c. Etching is further continued so that the exposed silicon and polysilicon is essentially removed from the sidewall of the partially etched trench 40. In FIG. 9d, more developed curvatures 30 are shown within the silicon sidewalls.

To finish forming the capacitor, standard DT processing is resumed while preserving curvatures 30. This includes reactive ion etching the remainder of the deep trench to its final determined depth and forming the collar isolation oxide, the N+ plate, and the storage node dielectric. This is followed by filling the formed trench with a conductive material such as N+ poly. To form the collar isolation oxide, either a deposition and RIE of a chemical vapor deposition ("the CVD") oxide process or, more preferably, a LOCOS process may be utilized. Once filled, the trench poly is slightly recessed and an insulating TTO is formed. Active areas of the transistor are then isolated by STI. As needed by the capacitor, well implants, gate oxidation, gate conductors, and source-drain diffusions are formed. Other structural features, such as gate conductors and wiring, are common in the field of trench DRAM, and, as such, are omitted for brevity. Hence, the remainder of the DT capacitor is formed so as to produce a capacitor such as that shown in FIG. 1 for example.

Figure 10:
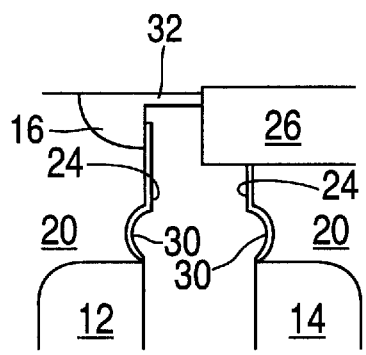
FIG. 10 is a cross-section of a deep trench capacitor having a notched sidewall in accordance with the present invention wherein the notch forms a concave portion to straddle the N+ plate in the P-well.
Figure 11:
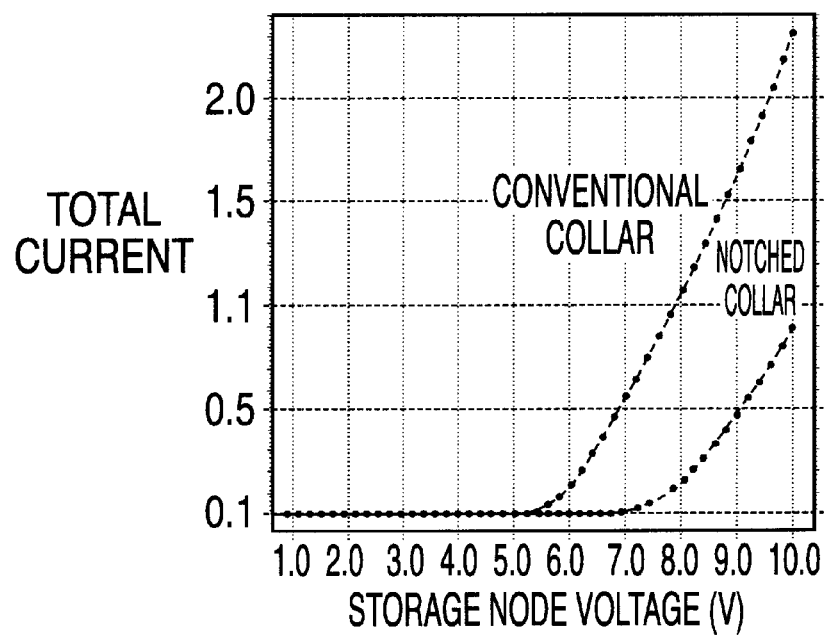
FIG. 11 is a graphical comparison of the vertical parasitic MOSFET of a conventional collar isolation compared to the notched collar of FIG. 10.

In a second embodiment, the notch in the sidewall of the DT is located so as to straddle the P-well and the N+ plate junction (junction is the region that separates the P-well and N+ plate regions) as shown in FIG. 10. The DT capacitor in FIG. 10 is similar to the capacitor shown in FIG. 1 except that one radius of minimum curvature 36 of the notch is into the P-well while the other radius of minimum curvature 34 is in the N+ plate. In this embodiment, the upper point of minimum radius of curvature 36 controls the threshold voltage of the vertical parasitic MOSFET. The lower point of minimum radius of curvature 34 does not serve to impede the parasitic current. While in this embodiment only one point of minimum radius of curvature impedes current, an increase of 2 volts in the parasitic threshold voltage is readily obtained. Particularly, this embodiment is compatible with a process in which the bottom of the collar oxide is self-registered to the location of the N+ plate (buried). In FIG. 11, a modeled electrical comparison of the second embodiment with a conventional collar structure is shown. As can be seen, about a 2 volt increase in the parasitic threshold voltage is reached. The minimum radius of curvature is about 30 nm, the collar oxide thickness is about 30 nm, and the doping profiles are approximately identical for both the notched and conventional collars.

Figure 12:
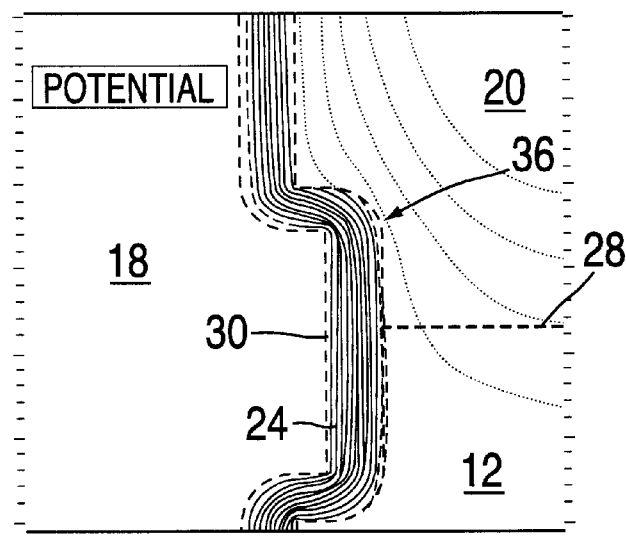
FIG. 12 is a cross-section of a portion of the sidewall of FIG. 10 wherein simulated equipotential contours are shown in the area of the sidewall notch.

Referring to FIG. 12, simulated equipotential contours are shown in the area of sidewall notch 30. As with the first embodiment, the distortion of the potential in the region about the concavity of notch 30 results in an electric potential barrier. As such, the threshold voltage of the vertical parasitic MOSFET is increased. The potential about the minimum curvature 36 is effective as a potential barrier. Because the minimum curvature 34 is beneath the junction line in the N+ plate, minimum curvature 34 is minimally effective as an electric potential barrier. For this example, the storage node voltage is about 6.0 volts, the N+ plate 12 voltage is about 0.75 volts, and the voltage of the P-well 20 is about −0.5 volts.

Figure 13:
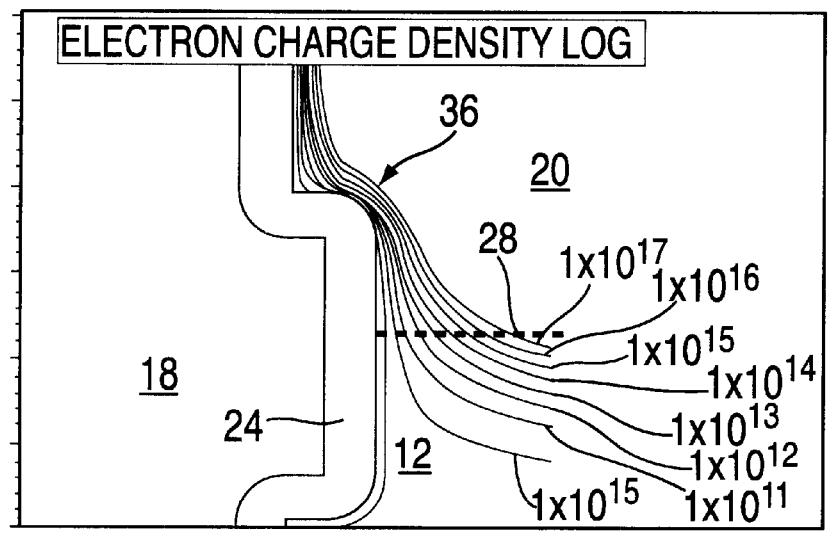
FIG. 13 is a cross-section of a portion of the sidewall of the FIG. 10 showing the electron charge density around the notch.

Referring to FIG. 13, a notch collar of the second embodiment is shown. With the notch of the second embodiment, the inversion electron concentration is greatly reduced at the point of minimum radius of curvature 36. For this model of the first embodiment, the storage node voltage is about 6.0 volts, the N+ plate 12 voltage is about 0.75 volts, and the voltage of the P-well 20 is about −0.5 volts.

Figure 14A:
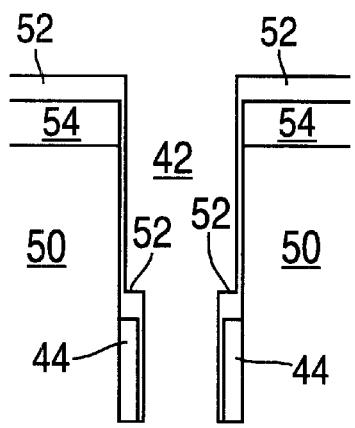
FIGS. 14a–14g illustrates a process of fabricating the structure of the first embodiment in accordance with a present invention wherein a notch is formed to straddle the N+ plate in the P-well.
Figure 14B:
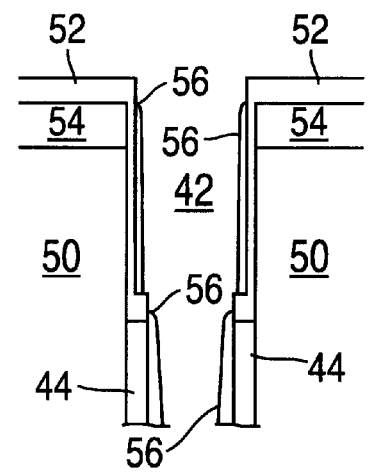
Figure 14C:
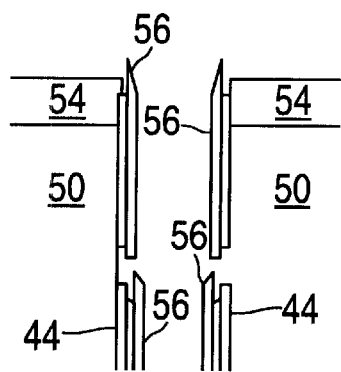
Figure 14D:
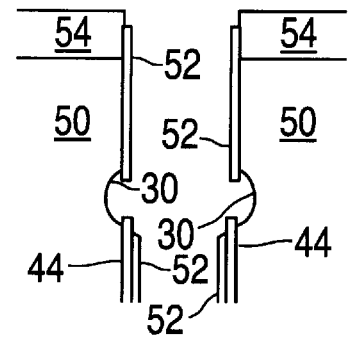
Figure 14E:
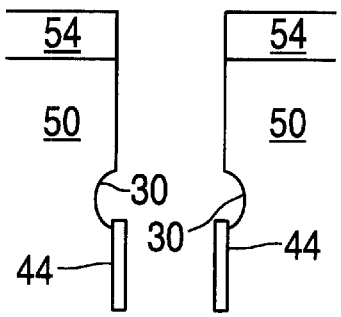
Figure 14F:
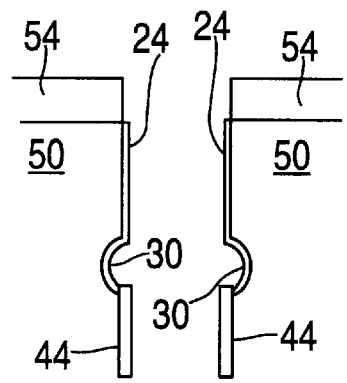
Figure 14G:
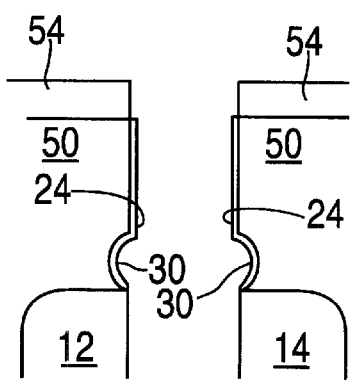

The process of fabricating the structure of the second embodiment is shown in FIGS. 14a–14g. In FIG. 14a, a silicon body 50 is shown having a pad nitride 54 on the surface of body 50 that is etched. Optionally, a deposited oxide layer (such as borosilicate glass) maybe formed over pad nitride 54 prior to etching the trench. In body 50, a trench 42 is shown etched to the final desired depth by an etching process such as RIE. After forming trench 42, nitride spacers 44 are formed using a deposition process such as CVD and RIE. The nitride spacers 44 are recessed to the desired depth of P-well to N+ plate junction using resist and etch back processes. While recessing the nitride spacers 44, the pad nitride 54 is also thinned. Thereafter, a layer of HDP oxide 52 is deposited over the exposed surfaces. Once the HDP oxide 52 layer is formed, poly spacers 56 are then formed on the trench sidewall as shown in FIG. 14b. These poly spacers 56 are etched such that the top of the spacers 56 are recessed below the horizontal surface of the DT capacitor which is immediately above the now recessed spacers 56. This is followed by isotropically etching the exposed HDP oxide 52 selective to silicon 50, poly spacers 56, pad nitride 54, and nitride spacers 44. The result of the isotropic etching is shown in FIG. 14c. Notch 30 is then formed into the sidewalls of the DT as shown in FIG. 14d. This is achieved by selectively isotropically etching the exposed silicon and poly to form the notch 30. As shown in FIG. 14e, the remaining HDP oxide 52 is isotropically etched from the walls, and then, a collar oxide 24 is grown by a LOCOS process for example over the exposed silicon walls of the DT as shown in FIG. 14f. After this, nitride spacers 44 are removed. N+ plates (buried) 12 and 14 are formed followed by applying a node dielectric over the exposed sidewall surfaces of the DT. See FIG. 14g. Hereafter, conventional trench storage DRAM processing resumes as in the first embodiment resulting in a DT capacitor as shown in FIG. 10. Note that the cross-section shown in FIG. 10 is after stripping the pad nitride 54 following STI planarization.

As to a third embodiment, a cross-sectional portion of the DT capacitor's sidewall is shown in FIG. 1 with notch 30 being completely positioned above N+ plate 12 and into P-well 20. Although the resultant structure of the third embodiment is similar to the first embodiment, the process of formation is different.

Figure 15A:
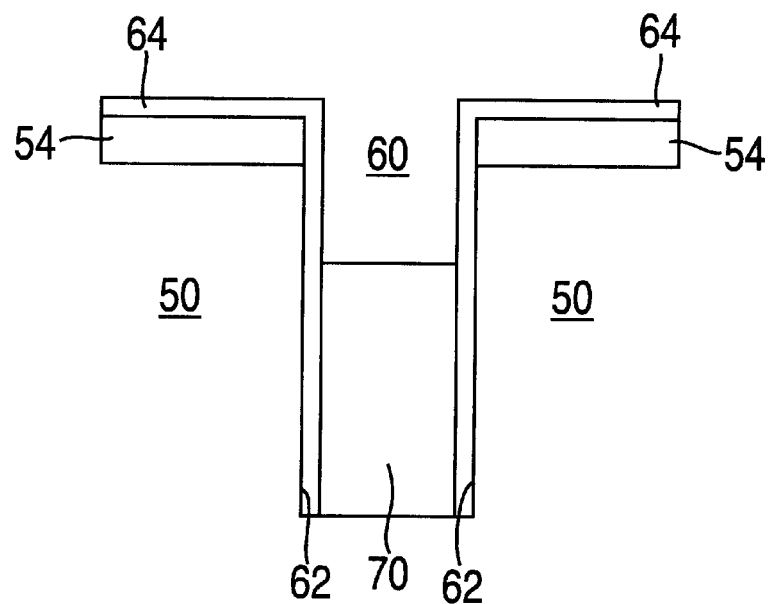
FIGS. 15a–15h illustrates a process of fabricating the structure of the first embodiment in accordance with a present invention wherein a notch is formed in the P-well above the N+ plates.
Figure 15B:
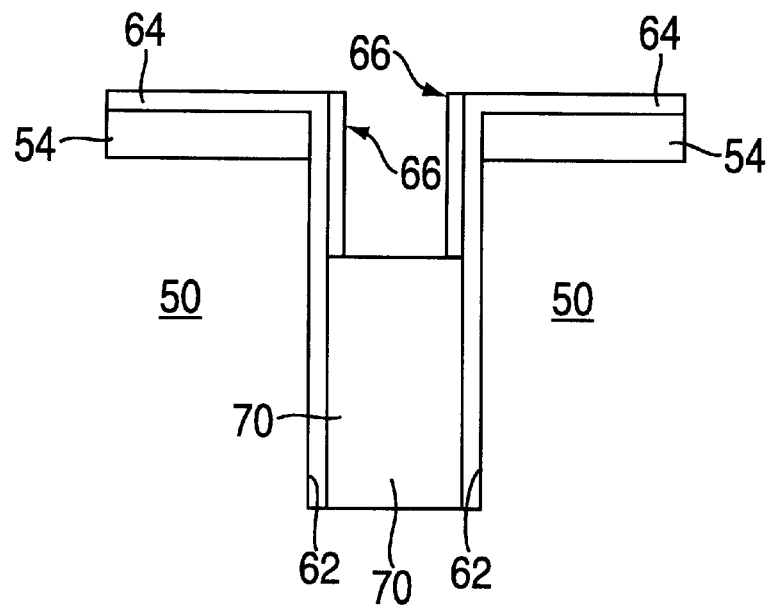
Figure 15C:
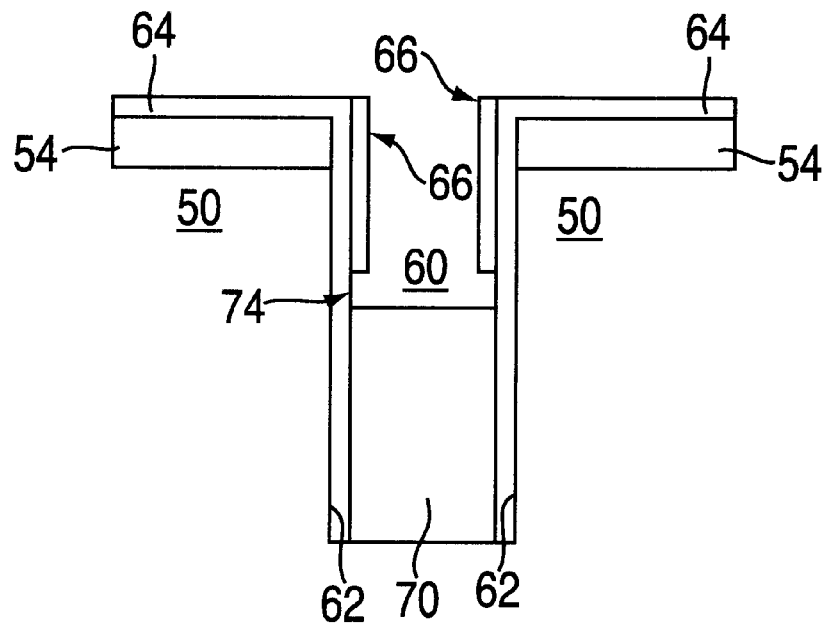
Figure 15D:
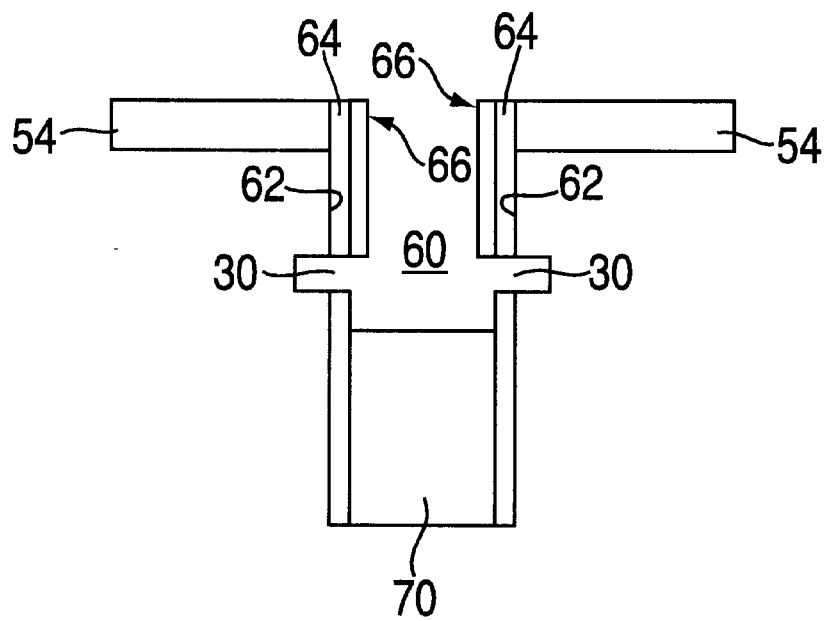
Figure 15E:
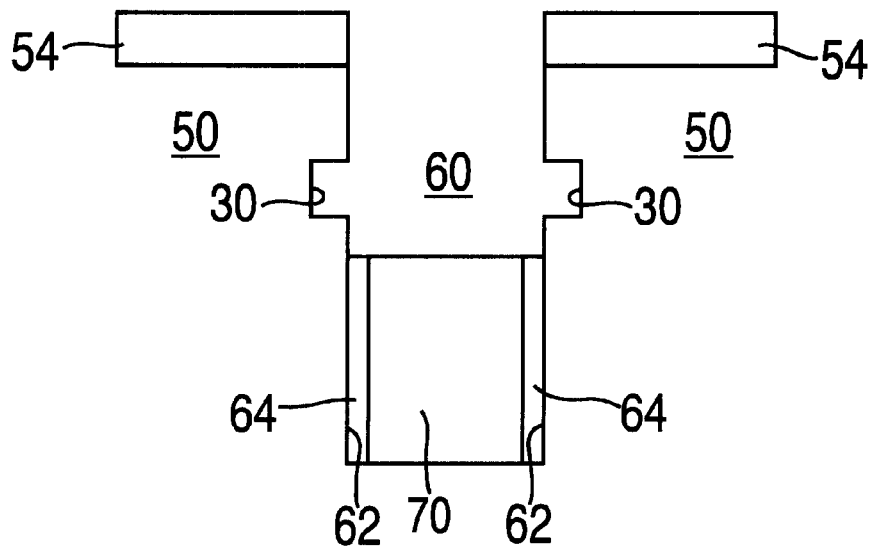
Figure 15F:
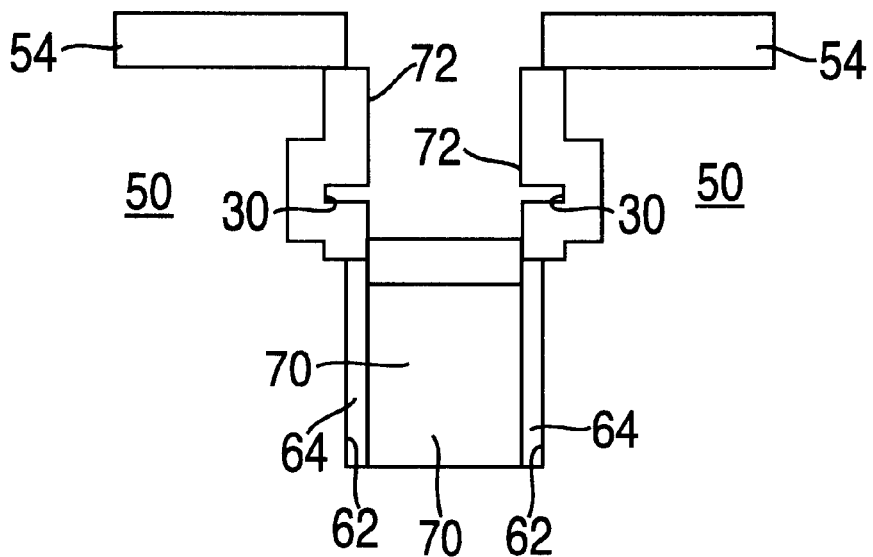
Figure 15G:
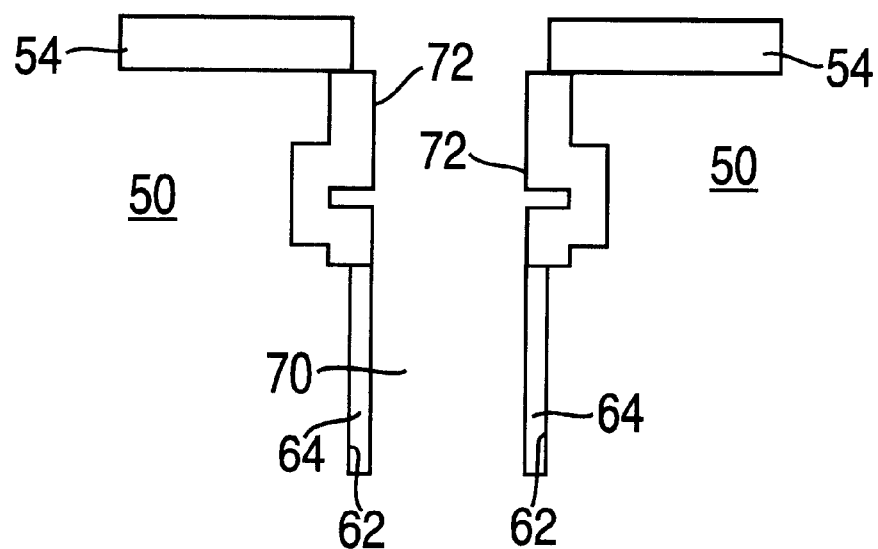
Figure 15H:
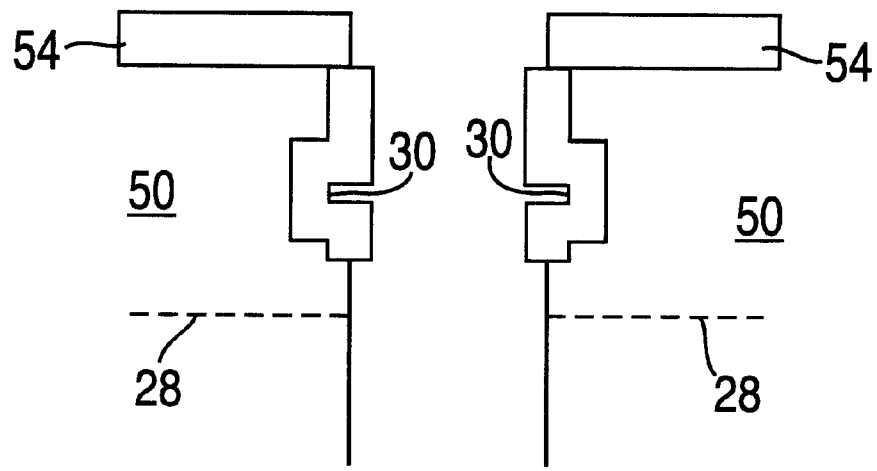

The process of fabricating the structure of the third embodimentis shown in FIGS. 15a–15h. In FIG. 15a, a silicon body 50 having a pad 54 surface layer is shown following a DT etching whereby trench 60 is formed. Within trench 60, a thin pad oxide 62 is grown to form only on the exposed silicon walls of the trench. Thereafter, a layer of nitride 64 is deposited upon pad oxide 62. Trench 60 is then filled with sacrificial polysilicon 70 that is subsequently planarized and recessed to a desired depth where notch 30 in the trench sidewall will be formed. As shown in FIG. 15b, oxide spacer 66 is formed on the pad nitride 64 that is within the exposed trench walls. Thereafter, the polysilicon 70 is recessed further into trench 60 using etchants selective to oxide and nitrides. This forms a notch region 74 beneath oxide spacer 66 and above polysilicon 70 as shown in FIG. 15c. Following this formation, the exposed nitride 64 is isotropically etched, selective to oxide, so that the underlying pad oxide 62 on the sidewall is exposed. The thin pad oxide 62 is then etched to expose sidewall silicon within trench 60. Subsequently, the exposed silicon is isotropically etched, selective to nitride and oxide, to form sidewall notch 30 as shown in FIG. 15d. The oxide spacer 66 and exposed nitride 64 and pad oxide 62 are then removed using isotropic etching. This results in exposing the silicon sidewall of trench 60 above polysilicon 70 as shown in FIG. 15e. Thereafter, a LOCOS collar 72 is formed on the exposed sidewall of trench 60 and above the remaining polysilicon 70 as shown in FIG. 15f. In forming the remainder of the trench, the oxide formed on polysilicon 70 from the LOCOS is removed via an RIE. Once the oxide is essentially removed, the remaining sacrificial polysilicon 70 is etched out of trench 60 as shown in FIG. 15g. To complete the DT formation, the remaining nitride sidewall layer is removed by etching. As shown in FIG. 15h, a DT having a notch 30 in the collar region lying above the P-well/N+ plate junction is achieved. Thereafter, typical DT formation can resume to form the buriedplate, node dielectric, N+ doped DT polysilicon fill, and planarization. Further, poly recesses and strap formation, STI, well implants, gate oxide, gate conductors, source drain and any other customary additions can be included.

The formation of the notch within the sidewall of the DT described above provides a DT storage capacitor having a significantly increased threshold voltage between the buried-strap out-diffusion and the N+ capacitor plate as compared to a conventional arrangement. The DT storage capacitor reduces storage trench fill difficulties by utilizing a lower aspect ratio and collar oxide thickness. Another improvement is that retention time distributions and yield losses are improved because the high well doping that is normally required to suppress the vertical parasitic MOSFET is reduced. Also, the electrical thickness of the collar oxide in the region of the curvature of the notch results in an improved storage charge capacity and lower yield loss.

While preferred embodiments have been shown and described, various modifications and substitutions may be made thereto without departing from the spirit and scope of the invention as defined in the appended claims. Accordingly, it is to be understood that the present invention has been described by way of illustration and not limitation.

What is claimed is:

1. A deep trench capacitor, comprising:

a silicon substrate;

a trench within said silicon substrate, said trench having one or more walls;

first and second N+ plates positioned within said silicon substrate at a bottom portion of said trench;

a node dielectric layer on the sidewalls of a lower portion of said trench;

a P-well region within said silicon substrate positioned above said first and said second N+ plates;

a notch formed within said one or more walls of said trench, said notch further being formed above said first and said second N+ plates;

a N+ strap disposed adjacent to said trench;

an STI positioned adjacent to said trench and on a top portion of said silicon substrate;

a first oxide coating disposed on said wails of said trench;

a polycrstalline silicon disposed within said trench; and a second oxide coating disposed over said trench.

2. A deep trench capacitor, comprising:

a silicon substrate;

a trench within said silicon substrate, said trench having one or more walls;

first and second N+ plates positioned within said silicon substrate at a bottom portion of said trench;

a node dielectric layer on the sidewalls of a lower portion of said trench;

a P-well region within said silicon substrate positioned above said first and said second N+ plates;

a notch formed within said one or more walls of said trench, said notch further being formed to overlap said first and said second N+ plates and said P-well region;

a N+ strap disposed adjacent to said trench;

an STI positioned adjacent to said trench and on a top portion of said silicon substrate;

a first oxide coating disposed on said walls of said trench;

a polycrystalline silicon disposed within said trench; and a second oxide coating disposed over said trench.

3. A deep trench capacitor, comprising:

a trench formed within a substrate, said trench including one or more walls;

a buried plate of a first conductivity type formed within said silicon substrate at a bottom portion of said trench, said buried plate comprising a fist capacitor electrode;

a node dielectric layer formed upon the sidewalls of a lower portion of said trench;

a collar oxide formed upon the sidewalls of an upper portion of said trench a well region of a second conductivity type within silicon substrate and positioned above said buried plate;

a notch formed along said collar oxide and extending into said well region;

a strap of said first conductivity type disposed adjacent to said upper portion of said trench; and a polycrystalline fill disposed within said trench, said polycrystalline fill comprising a second capacitor electrode, with said polycrystalline fill being of said first conductivity type;

wherein said notch increases a threshold voltage of a vertical parasitic MOSFET defied by said strap, said buried plate and said polyclstalline fill material.

4. The deep trench capacitor of claim 3, wherein said notch is formed above said buried plate.

5. The deep trench capacitor of claim 3, wherein said notch is formed to overlap said buried plate and said well region.

6. The deep trench capacitor of claim 3, wherein said notch is concave.

7. The deep trench capacitor of claim 6, wherein said concave notch has at least one minimum radius of curvature of about 30 nanometers.

8. The deep trench capacitor of claim 6, wherein said oxide collar has a thickness of about 30 nm.

9. The deep trench capacitor of claim 6, wherein:

said first conductivity type is N+ type; and said second conductivity type is P type.

* * * * *